United States Patent
Luo et al.

(10) Patent No.: US 11,641,787 B2
(45) Date of Patent: May 2, 2023

(54) SELF-RECTIFYING RESISTIVE MEMORY AND FABRICATION METHOD THEREOF

(71) Applicant: Institute of Microelectronics, Chinese Academy of Sciences, Beijing (CN)

(72) Inventors: Qing Luo, Beijing (CN); Hangbing Lv, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/767,091

(22) PCT Filed: Mar. 28, 2018

(86) PCT No.: PCT/CN2018/080852
§ 371 (c)(1),
(2) Date: May 26, 2020

(87) PCT Pub. No.: WO2019/183828
PCT Pub. Date: Oct. 3, 2019

(65) Prior Publication Data
US 2021/0013404 A1 Jan. 14, 2021

(51) Int. Cl.
*H10N 70/00* (2023.01)
*H01L 45/00* (2006.01)

(52) U.S. Cl.
CPC ........ *H01L 45/1233* (2013.01); *H01L 45/146* (2013.01); *H01L 45/1633* (2013.01)

(58) Field of Classification Search
CPC .............. H01L 45/1233; H01L 45/146; H01L 45/1633
See application file for complete search history.

(56) References Cited

U.S. PATENT DOCUMENTS

| 2003/0132458 | A1 | 7/2003 | Van Brocklin |
| 2008/0278990 | A1* | 11/2008 | Kumar ................ H01L 45/1608 365/148 |

(Continued)

FOREIGN PATENT DOCUMENTS

| CN | 101425559 A | 5/2009 |
| CN | 101783388 A | 7/2010 |

(Continued)

OTHER PUBLICATIONS

Donghyun Kim, Schottky Barrier Formation, Stanford University, Winter 2007 (Year: 2007).*

(Continued)

*Primary Examiner* — Shih Tsun A Chou
(74) *Attorney, Agent, or Firm* — Davis Wright Tremaine LLP; Michael J. Donohue

(57) ABSTRACT

The present disclosure provides a self-rectifying resistive memory, including: a lower electrode; a resistive material layer formed on the lower electrode and used as a storage medium; a barrier layer formed on the resistive material layer and using a semiconductor material or an insulating material; and an upper electrode formed on the barrier layer to achieve Schottky contact with the material of the barrier layer; wherein, the Schottky contact between the upper electrode and the material of the barrier layer is used to realize self-rectification of the self-rectifying resistive memory. Thus, no additional gate transistor or diode is required as the gate unit. In addition, because the device has self-rectifying characteristics, it is capable of suppressing read crosstalk in the cross-array.

2 Claims, 5 Drawing Sheets

(56) References Cited

U.S. PATENT DOCUMENTS

| | | | | |
|---|---|---|---|---|
| 2013/0121060 A1* | 5/2013 | Lee | .................... | G11C 11/5685 |
| | | | | 257/E21.52 |
| 2014/0306173 A1 | 10/2014 | Huang | | |
| 2016/0093802 A1 | 3/2016 | Hou et al. | | |
| 2016/0336066 A1* | 11/2016 | Lin | .................... | G11C 13/0064 |
| 2017/0005262 A1* | 1/2017 | Hwang | .................... | H01L 45/08 |

FOREIGN PATENT DOCUMENTS

| | | | |
|---|---|---|---|
| CN | 102280577 A | | 12/2011 |
| CN | 102903845 A | | 1/2013 |
| CN | 103247335 | | 8/2013 |
| CN | 104795492 | | 7/2015 |
| CN | 104795492 A | * | 7/2015 |
| CN | 105870321 A | | 8/2016 |

OTHER PUBLICATIONS

Raymond T. Tung, The physics and chemistry of the Schottky barrier height, Applied Physics Reviews 1,011304 (2014) (Year: 2014).*

Gu et al., Effective work function of Pt, Pd, and Re on atomic layer deposited HfO2, Applied Physics Letters 89, 082907 (2006) (Year: 2006).*

Jiantao Zhou, Resistive Switching Memory and Reconfigurable Devices, PhD Thesis, University of Michigan, 2016 (Year: 2016).*

Ma, Haili et al., "Self-Rectifying Resistive Switching Memory with Ultralow Switching Current in Pt/Ta2O5/HfO2-x/Hf Stack," Nanoscale Research Letters, 2017, 12:118.

International Search Report dated Dec. 28, 2018, issued in International Patent Application No. PCT/CN2018/080852, filed Mar. 28, 2018, 7 pages.

* cited by examiner

SELF-RECTIFYING RESISTIVE MEMORY AND FABRICATION METHOD THEREOF

CROSS-REFERENCE TO RELATED APPLICATION

This application is a Section 371 National Stage Application of International Patent Application No. PCT/CN2018/080852, filed on Mar. 28, 2018, entitled "SELF-RECTIFYING RESISTIVE MEMORY AND PREPARATION METHOD THEREFOR," which is incorporated herein by reference in its entirety.

TECHNICAL FIELD

The present disclosure relates to the field of microelectronics manufacturing and memory, and in particular, to a self-rectifying resistive memory and a fabrication method thereof.

BACKGROUND

The memory plays an important role in the semiconductor market and may be generally classified into the volatile memory and the non-volatile memory. The volatile memory means that the information in the memory can only be maintained when the power is applied, and the information stored therein will be lost when the power is not applied. Whereas the main feature of the non-volatile memory is that it is capable of maintaining the information stored therein for a long time without power. With the increasing popularity of portable electronic devices, the non-volatile memory is becoming more and more important in embedded applications. Due to the explosive expansion of emerging markets such as the Internet of Things, artificial intelligence, smart cars and virtual reality, storing and computing large amounts of data in electronic terminals requires high-density embedded memories. A resistive memory is considered to be the most promising memory for future embedded applications because of their simple structure, easy integration, and low power consumption.

The resistive memory has a metal/oxide/metal (MIM) capacitor structure, and the device may be reversibly converted between a high resistance state (HRS) and a low resistance state (LRS) by an electrical signal to implement storage functions. Due to the simple structure of the resistive memory, it is very advantageous to realize a high-density cross-array structure.

Three-dimensional integration of the resistive memory includes stacked three-dimensional structures and vertical structures. Three-dimensional vertical resistive memory (3DVRRAM) has a lower cost while achieving high-density integration, so it has a better application prospect. However, in the structure of the three-dimensional vertical resistive memory, there is no way to integrate the diode, and only a single R structure can be used. The cross array of single R structure has the problem of a read crosstalk due to the presence of a low-impedance current leakage path. The solution to this problem is that a gate tube should be connected in series with R. For example, a transistor is connected in series with R to form a 1T1R structure, or a diode is connected in series with R to form a 1D1R structure. The 1T1R structure cannot be used for 3D integration because it requires additional gate transistors and the transistors need to occupy the area of the substrate silicon. Therefore, in the structure of the three-dimensional vertical resistive memory, the resistive memory cell needs to have both resistive characteristics and rectification characteristics.

Most of the self-rectifying resistive devices reported so far cannot achieve CMOS process compatibility. A few self-rectifying devices that can be fabricated under standard processes have an operation voltage above 6V, which do not match the 5V voltage value of the logic device to be matched with the memory.

SUMMARY

According to an aspect of the present disclosure, there is provided a self-rectifying resistive memory, comprising: a lower electrode; a resistive material layer formed on the lower electrode and used as a storage medium; a barrier layer formed on the resistive material layer and using a semiconductor material or an insulating material; and an upper electrode formed on the barrier layer to achieve Schottky contact with the insulating material of the barrier layer; wherein, the Schottky contact between the upper electrode and the insulating material of the barrier layer is used to realize self-rectification of the self-rectifying resistive memory.

In some embodiments of the present disclosure, the barrier layer is a metal oxide.

In some embodiments of the present disclosure, the metal oxide comprises $ZrO_2$, $HfO_2$, $TiO_2$, $SiO_2$, $Ta_2O_5$, $Y_2O_3$, $NbO_3$, $ZnO$, $Tb_2O_3$, $CuO$, $La_2O_3$, $Ga_2O_3$, $Tb_2O_3$, $Yb_2O_3$.

In some embodiments of the present disclosure, a thickness of the material of the barrier layer is 2 nm to 5 nm, and an operation voltage between the upper electrode and the lower electrode of the self-rectifying resistive memory is less than 5V.

In some embodiments of the present disclosure, the upper electrode is formed on the barrier layer and comprises at least one of Pd, W, Al, Cu, Ru, Ti, Ta, TiN, TaN, $IrO_2$, ITO and IZO.

In some embodiments of the present disclosure, the material of the barrier layer is $HfO_2$, and a material of the upper electrode is Pd.

In some embodiments of the present disclosure, a material of the resistive material layer is formed by high temperature annealing the lower electrode in an oxygen-rich environment, and has a thickness of 5 nm to 60 nm.

In some embodiments of the present disclosure, the lower electrode comprises at least one of W, Al, Ti, Ta, Ni, Hf, TiN, and TaN.

According to another aspect of the present disclosure, there is provided a fabrication method of the above self-rectifying resistive memory, comprising:

step S1, forming a lower electrode;

step S2, forming a resistive material layer on a layer of the lower electrode;

step S3, forming a barrier layer on the resistive material layer; and step S4, forming an upper electrode on the barrier layer to achieve Schottky contact with an insulating material of the barrier layer.

In some embodiments of the present disclosure, the lower electrode is fabricated by one of electron beam evaporation, chemical vapor deposition, pulsed laser deposition, atomic layer deposition, and sputtering. The resistive material layer is fabricated by thermal oxidation, in which the lower electrode is subjected to high temperature annealing in an oxygen-rich environment. The barrier layer is fabricated by one of electron beam evaporation, chemical vapor deposition, pulsed laser deposition, atomic layer deposition, and sputtering. The upper electrode is fabricated by one of electron beam evaporation, chemical vapor deposition, pulsed laser deposition, atomic layer deposition, and sputtering.

It can be seen from the above technical solution that the self-rectifying resistive memory and the fabrication method thereof of the present disclosure have at least one of the following beneficial effects.

(1) A resistive material layer is used as a storage medium, and self-rectification is achieved by using a Schottky contact between a barrier layer and an upper electrode material, without the need for an additional gate transistor or diode as a gate unit. In addition, because the device has self-rectifying characteristics, it is capable of suppressing read crosstalk in the cross-array.

(2) Since no additional gate device is required, the self-rectifying resistive memory can be applied not only to a two-dimensional cross array, but also to a three-dimensional stacked cross array, and can be integrated into a three-dimensional vertical cross array. Therefore, the integration density of the memory is greatly improved, the cost is reduced, and the structure is simple and easy to integrate.

(3) By using materials that are fully compatible with CMOS process, the thickness of the barrier layer is reduced, and a self-rectifying device with low operation voltage is realized. The operation voltage can be controlled below 5V, which is suitable for embedded applications.

Figure 1:
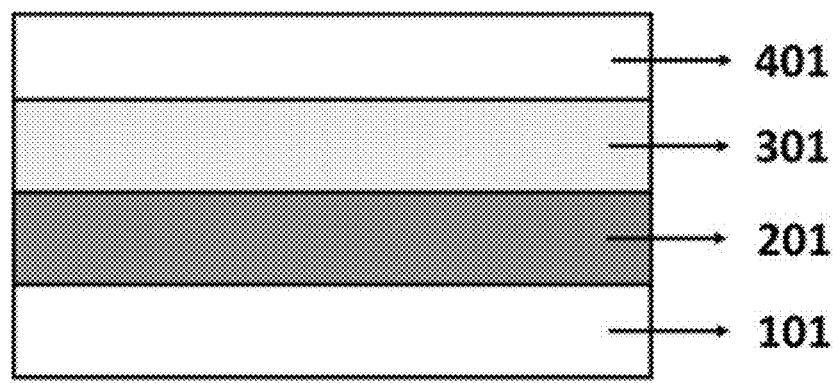
FIG. 1 is a schematic structural diagram of a self-rectifying resistive memory according to an embodiment of the present disclosure.

DESCRIPTION OF SYMBOLS OF MAIN ELEMENTS OF THE EMBODIMENT OF THE PRESENT DISCLOSURE IN THE DRAWINGS

101. Lower electrode; 201. Resistive material layer; 301. Barrier layer; 401. Upper electrode.

DETAILED DESCRIPTION

To make the objectives, technical solutions, and advantages of the present disclosure clearer, the present disclosure will be further described in detail below in conjunction with the specific embodiments and with reference to the accompanying drawings.

Some embodiments of the disclosure will be described more fully hereinafter with reference to the appended drawings, in which some but not all of the embodiments will be shown. In fact, the various embodiments of the disclosure may be embodied in many different forms and should not be construed as limited to the embodiments set forth herein; rather, these embodiments are provided so that the disclosure meets applicable legal requirements.

In a first exemplary embodiment of the present disclosure, there is provided a self-rectifying resistive memory. FIG. 1 is a schematic structural diagram of a self-rectifying resistive memory according to a first embodiment of the present disclosure. As shown in FIG. 1, the self-rectifying resistive memory includes a lower electrode 101, a resistive material layer 201, a barrier layer 301, and an upper electrode 401 sequentially from bottom to top. The resistive memory has the function of resistive transition, and also has self-rectifying characteristics.

Hereinafter, each component of the self-rectifying resistive memory of this embodiment is described in detail.

The lower electrode 101 may be composed of one or more of simple substances W, Al, Ti, Ta, Ni, Hf, TiN, and TaN. The lower electrode 101 is fabricated by one of electron beam evaporation, chemical vapor deposition, pulsed laser deposition, atomic layer deposition, or sputtering. The thickness and shape of the lower electrode 101 are not limited by this embodiment.

A resistive material layer 201 with a material thickness from 5 nm to 60 nm is formed on the lower electrode 101. The resistive material layer 201 is fabricated as a storage medium by a thermal oxidation method. That is, the lower electrode is subjected to high-temperature annealing in an atmosphere of $O_2$ or $O_3$, and the annealing temperature is 200° C. to 400° C., and the oxidation time is not limited by this embodiment.

The barrier layer 301 formed on the resistive material layer 201 may be formed of a metal oxide such as $ZrO_2$, $HfO_2$, $TiO_2$, $SiO_2$, $Ta_2O_5$, $Y_2O_3$, $NbO_3$, $ZnO$, $Tb_2O_3$, $CuO$, $La_2O_3$, $Ga_2O_3$, $Tb_2O_3$, $Yb_2O_3$ and the like. In some embodiments, the barrier layer 301 uses a fully-matched metal oxide, and the fully-matched metal oxide is an oxide in which the metal is in the highest valence state. The material thickness of the barrier layer 301 is 2 nm to 5 nm. The barrier layer 301 is fabricated by one of electron beam evaporation, chemical vapor deposition, pulsed laser deposition, atomic layer deposition, and sputtering. Because the thickness of the barrier layer is relatively small, the operation voltage can be controlled below 5V, which is suitable for embedded applications.

The upper electrode 401 is formed on the barrier layer 301. The upper electrode 401 may be composed of one or more of Pd, W, Al, Cu, Ru, Ti, Ta, TiN, TaN, $IrO_2$, ITO, and IZO. The upper electrode 401 is fabricated by one of electron beam evaporation, chemical vapor deposition, pulsed laser deposition, atomic layer deposition, and sputtering. The thickness and shape of the metal electrode are not limited by this embodiment.

The materials of the barrier layer 301 and the upper electrode 401 are used to realize Schottky contact self-rectification. Due to the difference in work function in the contact between the metal and the material of the barrier layer, a Schottky junction will be formed, which is equivalent to the function of a Schottky diode. Therefore, rectification can be realized, and no additional gate transistor or diode is required as the gate unit. In addition, since the resistive device does not require additional gate devices, the self-rectifying resistive memory can be applied not only to a two-dimensional cross array but also to a three-dimensional stacked cross structure, which has a greater integration density and lower costs. Therefore, the device of the present disclosure greatly improves the integration density of the memory, reduces the cost, and has a simple structure and easy integration.

As a preferred embodiment, in the self-rectifying resistive memory of this embodiment, the lower electrode uses W material, the resistive material layer uses $WO_x$ material, the barrier layer uses $HfO_2$ material, and the upper electrode uses Pd material.

Figure 2:
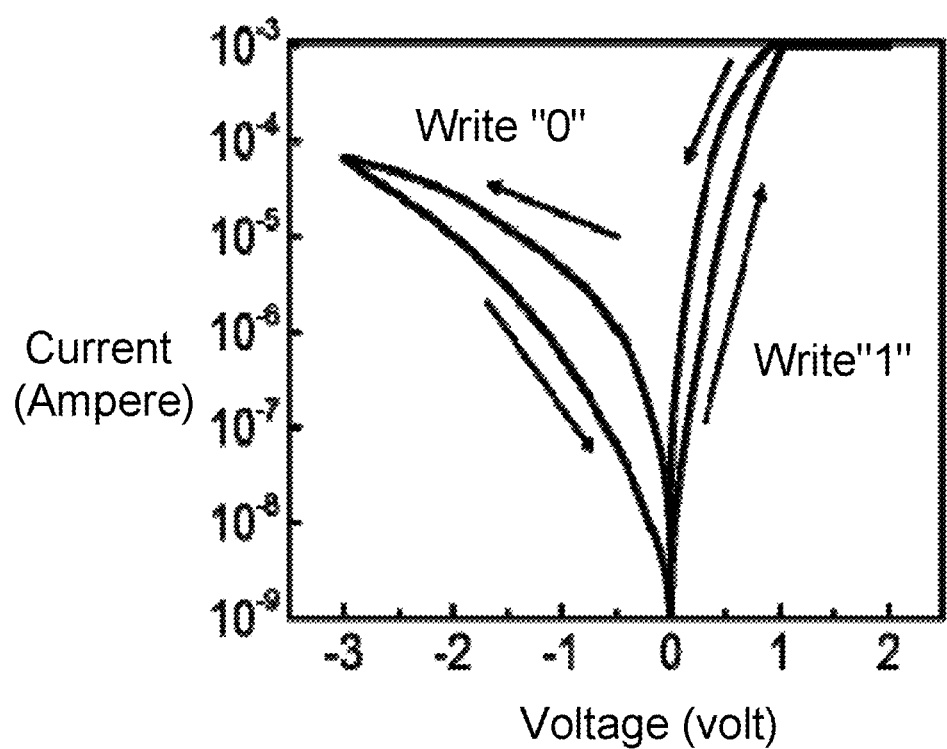
FIG. 2 is a current-voltage characteristic curve diagram based on a self-rectifying resistive memory according to an embodiment of the present disclosure.

FIG. 2 is a current-voltage characteristic curve diagram based on a self-rectifying resistive memory according to the embodiment. FIG. 2 shows a current-voltage characteristic curve of a resistive memory formed by $W/WO_x/HfO_2/Pd$ in a DC scan mode. At the beginning, the resistive memory device is in a low-resistance state "1". When the applied bias voltage reaches −3V, the resistive memory device changes from the low-resistance state "1" to a high-resistance state "0". When the reverse voltage is used for scanning, the resistive memory device changes from the high-impedance state "0" to the low-impedance state "1" again. It can be clearly seen from the curve that the low resistance state exhibits symmetrical rectification characteristics under positive and negative voltages. At a reading voltage of ±0.35V, the ratio of the forward current to the negative current is greater than 100, which has the function of a rectifier diode. This can effectively suppress read crosstalk in the cross-array structure and avoid misreading.

Figure 3:
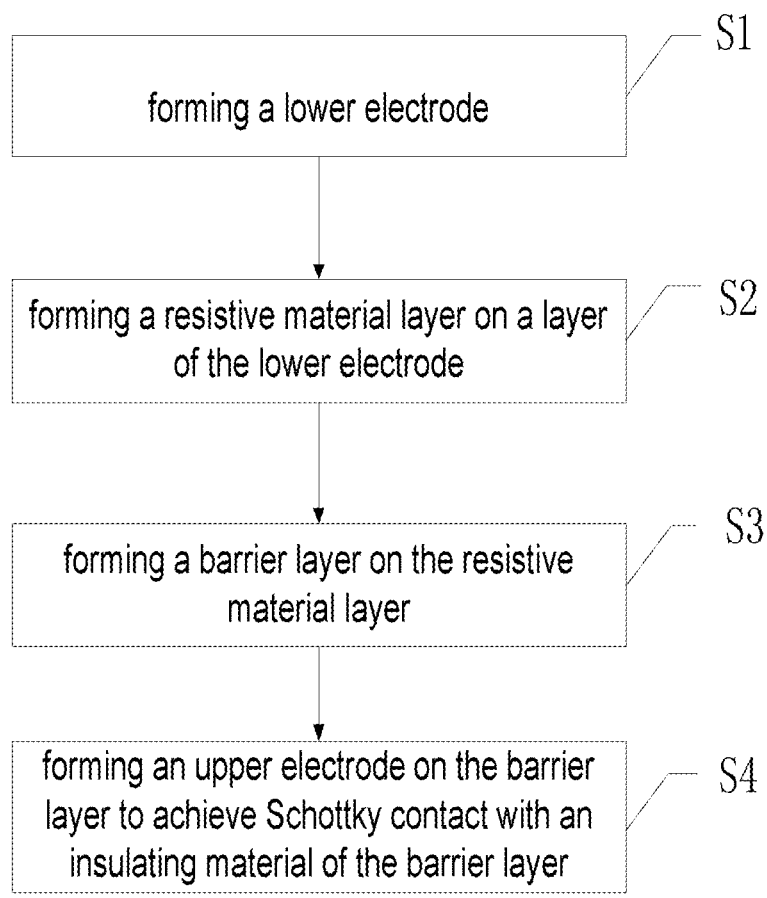
FIG. 3 is a flowchart of fabricating a self-rectifying resistive memory according to an embodiment of the present disclosure.

In a second exemplary embodiment of the present disclosure, a method for fabricating a self-rectifying resistive memory is provided. FIG. 3 is a flowchart of fabricating a self-rectifying resistive memory according to an embodiment of the present disclosure. The following describes the process of fabricating the self-rectifying resistive memory in detail with reference to FIGS. 3 to 7.

Figure 4:
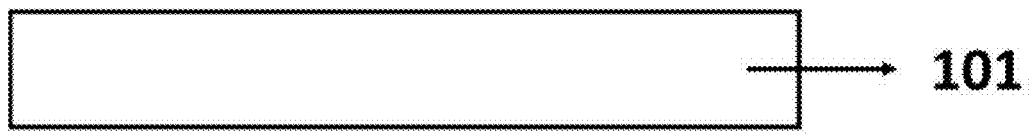
FIG. 4 is a schematic diagram of forming a lower electrode in the process of fabricating a self-rectifying resistive memory according to an embodiment of the present disclosure.

In step S1, a lower electrode 101 is formed. FIG. 4 is a schematic diagram of forming the lower electrode in the process of fabricating the self-rectifying resistive memory according to an embodiment of the present disclosure.

As shown in FIG. 4, the lower electrode 101 may be formed by a chemical plating method or a sputtering method. As a preferred embodiment, the sputtering method is used in this embodiment to form the W lower electrode. The following process conditions may be used: power 25 W to 500 W; pressure: 0.1 Pa to 100 Pa; Ar gas flow: 0.5 sccm to 100 sccm, and its thickness is 10 nm to 500 nm.

Figure 5:
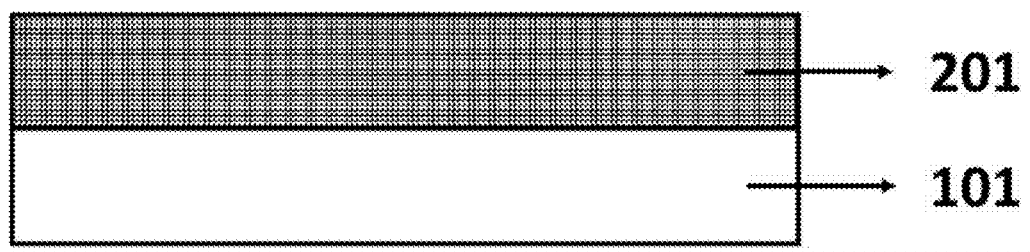
FIG. 5 is a schematic diagram of forming a resistive material layer in the process of fabricating a self-rectifying resistive memory according to an embodiment of the present disclosure.

In step S2, a resistive material layer 201 is formed on the lower electrode 101. FIG. 5 is a schematic diagram of forming a resistive material layer in the process of fabricating a self-rectifying resistive memory according to an embodiment of the present disclosure.

As shown in FIG. 5, the resistive material layer is formed by thermal annealing in an oxygen-rich environment. As a preferred embodiment, in this embodiment, the method of high temperature annealing in a plasma oxygen environment is used to form $WO_x$. The following process conditions are used: power: 100 W to 200 W; temperature: 200° C. to 400° C., and its thickness is 5 nm to 30 nm.

Figure 6:
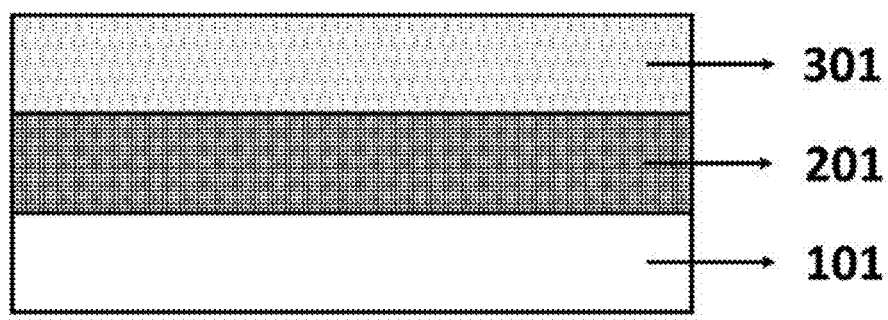
FIG. 6 is a schematic diagram of forming a barrier layer in the process of fabricating a self-rectifying resistive memory according to an embodiment of the present disclosure.

In step S3, a barrier layer 301 is formed on the resistive material layer 201. FIG. 6 is a schematic diagram of forming a barrier layer in the process of fabricating a self-rectifying resistive memory according to an embodiment of the present disclosure.

As shown in FIG. 6, as a preferred embodiment, $HfO_2$ is used as the barrier layer in this embodiment, and is formed by an atomic layer deposition method. The following process conditions are used: growth temperature: 250° C., pressure in the reaction chamber: less than 2 mBar, and its thickness is 2 nm to 5 nm.

Figure 7:
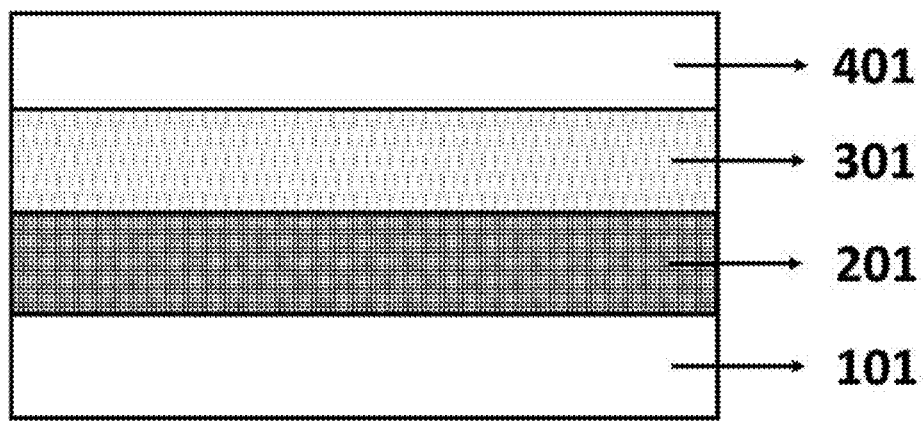
FIG. 7 is a schematic diagram of forming an upper electrode in the process of fabricating a self-rectifying resistive memory according to an embodiment of the present disclosure.

In step S4, an upper electrode 401 is formed on the barrier layer 301. FIG. 7 is a schematic diagram of forming an upper electrode in the process of fabricating a self-rectifying resistive memory according to an embodiment of the present disclosure.

As shown in FIG. 7, as a preferred solution, in this embodiment, the upper electrode material is Pd, which is formed by sputtering. The process conditions are as follows: power 25 W to 500 W; pressure: 0.1 Pa to 100 Pa; Ar gas flow: 0.5 sccm to 100 sccm and its thickness is 10 nm to 500 nm.

So far, the fabrication of the resistive memory shown in FIG. 1 is completed.

Of course, according to actual needs, the fabrication method of the self-rectifying resistive memory of the present disclosure also includes other processes and steps. Since they are not related to the innovation of the present disclosure, they will not be repeated here.

In order to achieve the purpose of brief description, description of any technical feature that can be used for the same application in the above embodiment 1 is incorporated herein, and it is not necessary to repeat the same description.

Here, the embodiments of the present disclosure have been described in detail in conjunction with the accompanying drawings. It should be noted that the implementations that are not shown or described in the drawings or the text of the specification are all known to those ordinary skilled in the art and are not described in detail. In addition, the above definitions of the various elements and methods are not limited to the specific structures, shapes or manners mentioned in the embodiments, and those skilled in the art may simply modify or replace them.

It should also be noted that the directional terms mentioned in the embodiments, such as "upper", "lower", "front", "back", "left", "right", and the like, are only referring to the directions of the drawings, and not used to limit the scope of protection of the present disclosure. The same elements are denoted by the same or similar reference numerals throughout the drawings. Conventional structures or configurations will be omitted when they may cause confusion to the understanding of the present disclosure.

The shapes and sizes of the various components in the drawings do not reflect the true size and proportions, but merely illustrate the contents of the embodiments of the present disclosure. In addition, in the claims, any reference signs placed between parentheses shall not be construed as a limitation.

Unless otherwise stated, numerical parameters in the present specification and the appended claims are approximations, and may vary depending upon the desired characteristics obtained through the teachings of the disclosure. In particular, all numbers expressing the composition contents, reaction conditions, and the like, which are used in the specification and claims, are to be understood as being modified by the term "about" in all cases. In general, it is meant to include a variation of ±10% for a specific amount in some embodiments, ±5% in some embodiments, ±1% in some embodiments and ±0.5% in some embodiments.

The word "comprising" does not exclude the presence of the elements or steps that are not recited in the claims. The word "a", "an" or "one" before the element does not exclude the presence of a plurality of such elements.

The specific embodiments described above further illustrate the purpose, technical solutions and beneficial effects of the present disclosure. It should be understood that the above description is only specific embodiments of the present disclosure and is not used to limit the present disclosure. Any modification, equivalent replacement, and improvement made within the spirit and principle of the present disclosure shall fall within the protection scope of the present disclosure.

We claim:

1. A self-rectifying resistive memory, comprising:
   a lower electrode;
   a resistive material layer formed on the lower electrode and used as a storage medium;
   a barrier layer formed on the resistive material layer and using a semiconductor material or an insulating material; and
   an upper electrode formed on the barrier layer to achieve Schottky contact with the material of the barrier layer;
   wherein, the Schottky contact between the upper electrode and the material of the barrier layer is used to realize self-rectification of the self-rectifying resistive memory;
   wherein, the barrier layer is a fully-matched metal oxide;
   wherein, a thickness of the material of the barrier layer is 2 nm to 5 nm, and an operation voltage between the upper electrode and the lower electrode of the self-rectifying resistive memory is less than 5V; and
   wherein, a material of the lower electrode is W, a material of the resistive material layer is $WO_x$, a material of the barrier layer is $HfO_2$, and a material of the upper electrode is Pd.

2. The self-rectifying resistive memory according to claim 1, wherein a material of the resistive material layer is formed by high temperature annealing the lower electrode in an oxygen-rich environment, and has a thickness of 5 nm to 60 nm.

* * * * *